(12) United States Patent
Bhuvanagiri et al.

(10) Patent No.: US 7,698,355 B2
(45) Date of Patent: Apr. 13, 2010

(54) MINIMAL AREA INTEGRATED CIRCUIT IMPLEMENTATION OF A POLYPHASE INTERPOLATION FILTER USING COEFFICIENTS SYMMETRY

(75) Inventors: Aditya Bhuvanagiri, Guntur (IN); Harvinder Singh, Delhi (IN); Rakesh Malik, Up (IN); Nitin Chawla, Up (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 1081 days.

(21) Appl. No.: 11/215,319

(22) Filed: Aug. 29, 2005

(65) Prior Publication Data
US 2006/0120494 A1    Jun. 8, 2006

(30) Foreign Application Priority Data
Aug. 27, 2004    (IN)    .................. 1630/DEL/2004

(51) Int. Cl.
G06F 17/17    (2006.01)
G06F 15/00    (2006.01)
G11C 19/00    (2006.01)
H04B 1/10    (2006.01)

(52) U.S. Cl. .................. 708/313; 377/64; 377/75; 377/77; 375/350

(58) Field of Classification Search ......... 708/300–323, 708/209; 375/350; 377/64, 75, 77
See application file for complete search history.

(56) References Cited

U.S. PATENT DOCUMENTS

| | | | | |
|---|---|---|---|---|
| 5,471,411 A | * | 11/1995 | Adams et al. | ............... 708/300 |
| 6,192,386 B1 | * | 2/2001 | Shinde | ........................ 708/313 |
| 6,898,255 B2 | * | 5/2005 | Kim | ............................. 375/350 |

* cited by examiner

Primary Examiner—Chat C. Do
Assistant Examiner—Kevin Hughes
(74) Attorney, Agent, or Firm—Lisa K. Jorgenson; E. Russell Tarleton; Seed IP Law Group PLLC

(57) ABSTRACT

A minimal area integrated polyphase interpolation filter uses a symmetry of coefficients for a channel of input data. The filter includes an input interface block for synchronizing the input signal to a first internal clock signal; a memory block for providing multiple delayed output signals; a multiplexer input interface block for outputting a selected plurality of signals for generating mirror image coefficient sets in response to a second set of internal control signals, a coefficient block for generating mirror image and/or symmetric coefficient sets, and to output a plurality of filtered signals, an output multiplexer block for performing selection, gain control and data width control on said plurality of filtered signals, an output register block synchronizing the filtered signals, and a control block generating clock signals for realization of the filter and to delay between two channels to access a coefficient set, thereby minimizing hardware in the filter.

11 Claims, 16 Drawing Sheets

MINIMAL AREA INTEGRATED CIRCUIT IMPLEMENTATION OF A POLYPHASE INTERPOLATION FILTER USING COEFFICIENTS SYMMETRY

BACKGROUND OF THE INVENTION

1. Field of the Invention

The present invention relates to a minimal area implementation of a polyphase interpolation filter and particularly to implementation of a polyphase interpolation filter using symmetry of coefficients for at least one channel of input data.

2. Description of the Related Art

In a Multirate DSP system, upsampling is the process of inserting zero valued samples between original samples for increasing the sampling rate. The process of upsampling induces undesired spectral images in the original signal. Interpolation is a process of upsampling followed by filtering that removes the undesirable spectral images. The concept of an interpolation filter is creating modified samples from the original samples as if the signal has been originally sampled at a higher rate. Interpolation implies inserting zero valued samples between each pair of input samples (zero stuffing), thereafter filtering the result obtained. The process of zero stuffing creates a higher-rate signal having a spectrum same as the original over the original bandwidth, but has images of the original spectrum centered on multiples of the original sampling rate, the images being eliminated by low pass filtering.

Hereafter in the description, mono L-fold Polyphase interpolation FIR filter is referred as 1-L-FIR filter. Stereo L-fold Polyphase interpolation FIR filter is referred as 2-L-FIR filter.

The implementation of an existing polyphase interpolation filter is discussed with the help of the following equations.

The generalized transfer function of a digital filter is given by:

$$H(z) = \sum_{n=-\infty}^{n=\infty} h(n)(Z)^{-n}, \tag{1}$$

where h(n) is the impulse response of the filter or the coefficient set and $Z^{-n}$ is delay of n clock cycles. A generalized digital filter can be used as an L-Fold interpolation filter, where L is the interpolation factor for the filter. An existing implementation of a 2-fold polyphase interpolation filter is hereby discussed.

For the polyphase implementation of a filter with a coefficient set h(n), even numbered coefficients and odd numbered coefficients are separated from each other, that result in the following transfer function.

$$H(z) = \sum_{n=-\infty}^{n=\infty} h(2n)(Z)^{-2n} + z^{-1} \times \sum_{n=-\infty}^{n=\infty} h(2n+1)(Z)^{-2n}, \tag{2}$$

where h(2n) are even coefficients, h(2n+1) are odd coefficients and $Z^{-2n}$ is the delay of 2n clock cycles.

The transfer function of an even coefficient bank $R_0(z)$ is given in the following equation.

$$R_0(z) = \sum_{n=-\infty}^{n=\infty} h(2n)(Z)^{-n}, \tag{3}$$

where h(2n) are even coefficients and $Z^{-n}$ is delay of n clock cycles.

Odd coefficient bank transfer function $R_1(z)$ is given in Equation (4):

$$R_1(z) = \sum_{n=-\infty}^{n=\infty} h(2n+1)(Z)^{-n}, \tag{4}$$

where h(2n+1) are odd coefficients and $Z^{-n}$ is delay of n clock cycles.

Substituting equation (3) and (4) into equation (2) to obtain equation (5);

$$H(z) = R_0(Z)^2 + z^{-1} R_1(Z)^2 \tag{5},$$

Extending the discussion of 2-Fold interpolation filter to a polyphase implementation of an L-fold polyphase interpolation filter would result in transfer function as in equation (6).

$$H(Z) = \sum_{l=0}^{L-1} Z^{-(L-1-l)} \times R_{L-1-l}(Z)^L \text{ where,} \tag{6}$$

$$R_{L-1-l}(Z) = \sum_{n=-\infty}^{n=\infty} r_{L-1-l}(n) Z^{-n}$$

where $r_{L-1-l}(n)$ is the impulse response of the L-1-l$^{th}$ coefficient bank, where l varies from 0 to L−1. Equation (6) implies that the L fold interpolation filter would involve L coefficient banks. The following discussion is about the existing method to obtain the structure of L fold interpolation filter.

The existing method, to realize the structure of L fold polyphase interpolation filter, is illustrated in FIG. 1. The existing method as shown in FIG. 1 has two parts: Part 1 being an algorithm to obtain the coefficient banks of L-fold polyphase interpolation filter; and Part 2 being a generalized structure to map the results obtained from the algorithm in Part 1.

As per the algorithm coefficient banks are formed by decimating coefficients by interpolation factor (L) as shown in FIG. 2. Let {h(0),h(1),h)(2), ... h(L−1),h(L),h(L+1) ... h(mL−2),h(mL−1),h(mL)} be the coefficient set of an L fold interpolation filter, where 'm' is any positive number.

The impulse response of the coefficient banks r0(n), r1(n) ... rL−1(n) is obtained by using the algorithm of FIG. 1 are as follows:

CB0 = $r_0(n)$ = {h(0),h(L),h(2L) ... h(mL)}

CB1 = $r_1(n)$ = {h(1),h(L+1) ... }

...

CBL−1 = $r_{L-1}(n)$ = {h(L−1),h(2L−1) ... h(mL−1)}, where $r_0(n)$, $r_1(n)$ ... $r_{L-1}(n)$ are impulse responses of coefficient banks.

The coefficient banks obtained are mapped onto an existing generalized structure as follows.

An existing generalized structure for an L-fold polyphase interpolation filter with, commutator as shown in FIG. 3, where X(n) is the input and Y(n) is the output and $R_0(Z)$, $R_1(Z)$, ... $R_{L-1}(Z)$ are the coefficient banks. The objective of the commutator is to output a coefficient bank from the set of coefficient banks. Extending the polyphase implementation discussion for a general filter to a 4-fold interpolation FIR filter with symmetric coefficients result in symmetric and mirror image coefficient banks.

This fact is further illustrated with an example structure of 1-L-FIR as given below.

For this example let the interpolation factor be '4' and the coefficient set be {10,20,30,40,50,60,70,80,90,80,70,60,50, 40,30,20,10}. FIG. 4 shows the graphical execution of the algorithm to find coefficient banks for an example. The four coefficient banks formed by decimating coefficients by interpolation factor 4 are:

CB0={$h(0),h(4),h(8),h(12),h(16)$}

CB1={$h(1),h(5),h(9),h(13)$}

CB2={$h(2),h(6),h(10),h(14)$}

CB3={$h(3),h(7),h(11),h(15)$}, where values of h(0) to h(16) for the example are;

$h(0)=h(16)=10$ $h(1)=h(15)=20$ $h(2)=h(14)=30$ $h(3)=h(13)=40$ $h(4)=h(12)=50$ $h(5)=h(11)=60$ $h(6)=h(10)=70$ $h(7)=h(9)=80$ $h(8)=90$ substituting the values of h(0) to h(16) in CB0 to CB3 the coefficient banks are;

CB0={10,50,90,50,10}

CB1={20,60,80,40}

CB2={30,70,70,30}

CB3={40,80,60,20}

The structure for realizing the polyphase implementation of the example is shown in FIG. 5, wherein the rectangles with $Z^{-1}$ (11) are unit sample delays, the triangles (12) are multipliers and the circles with '+' sign in them are adders (13). The operation of unit sample delays (11), multipliers (12), and adders (13), are explained later in the document. The plurality of unit sample delays (11), are connected to each other and resulting taps coming out of the unit sample delays (11), are connected to a plurality of multipliers (12). The multipliers receive a plurality of multiplicands from the unit sample delays, and the output of multipliers is connected to plurality of adders (13) connected to form coefficient banks (CB0, CB1, CB2, CB3). The output of the coefficient banks are connected to the commutator 14 to form a polyphase implementation of a FIR filter.

BRIEF SUMMARY OF THE INVENTION

The coefficients symmetry property of the polyphase FIR filters pertains to the generation of the symmetric and mirror image coefficient sets for optimal realization of coefficient bank structure. The structure in FIG. 5 does not utilize the mirror image property of the coefficient banks. Thus a need is felt to use the mirror image property of the coefficient banks for minimizing the implementation area of the polyphase interpolation filter.

Further, the existing method for polyphase filter realization is not efficient, as it requires the coefficient banks to be formed, and then observed for symmetry, to be compared with each other thereafter to find mirror image coefficient banks. Therefore the existing method proves to be inefficient, if the length of the filter is large and the interpolation factor is high. An efficient method is desirable to find the symmetric and mirror images coefficient banks for minimal hardware realization of the polyphase filter.

One embodiment of the present invention uses the property of coefficients symmetry for generating the mirror image coefficient banks.

One embodiment of the present invention provides a minimal area integrated circuit implementation of a polyphase interpolation filter by generating mirror image coefficient banks for one or more channels of input data.

One embodiment of the present invention provides a minimal area integrated circuit implementation of a polyphase interpolation filter using symmetry of coefficients for at least one channel of input data. The filter includes:

an input interface block for synchronizing the input signal to a first internal clock signal;

a memory block connected to the output of the input interface block for providing multiple delayed output signals in response to the synchronized input signal and the first internal clock signal;

a channel select multiplexer block receiving the synchronized output signals from the memory block of each channel and selecting a channel in response to a first set of internal control signals;

a multiplexer input interface block connected to the channel select multiplexer block for receiving input from the channel to output a plurality of signals for generating mirror image coefficient values in response to a second set of internal control signals;

a coefficient block receiving the plurality of signals for, generating mirror image coefficient sets and/or symmetric coefficient sets, and to output a plurality of filtered signals by performing multiplication and addition on, a set of coefficient inputs and the plurality of signals;

an output multiplexer block connected to the coefficient block for controlling the gain in the plurality of filtered signals and selecting a signal from the plurality of filtered signals followed by controlling the number of bits in the signal, thereby generating a filtered output signal, in response to a third set of internal control signals;

an output register block connected to the output multiplexer block for storing and synchronizing the filtered output signal, in response to a second internal clock signal; and a control block receiving an external input clock signal for generating the first and second internal clock signals; and the first, second and third internal control signals, for inducing delay between two channels to access one coefficient set, thereby minimizing the hardware requirement of coefficient set implementation in a polyphase interpolation filter, the multiplexer input interface block being a null set for a null mirror image coefficient set.

Further, one embodiment of the present invention provides a method for generating minimal area polyphase interpolation filter using symmetry of coefficients for one or more channels of input data. The method includes:

determining a filter-type variable by applying a modulus function on length and an interpolation factor of the polyphase filter;

determining mirror image and symmetric coefficient sets by performing computations on the length and interpolation factor of the filter, forming a set of coefficient bank, using an index of the mirror image and symmetric coefficient sets and the value of the interpolation factor, for decimating the mirror image and symmetric coefficients;

determining the number of unit sample delays to be generated in the memory block for each channel of the interpolation filter; and inducing a delay of one clock cycle between said first internal clock signal and said external input clock signal for an odd interpolation factor; and a delay of two clock cycles for even values of the interpolation factor and said filter-type variable.

Thus, one embodiment of the present invention provides a minimal area integrated circuit implementation of a Polyphase Interpolation Filter using symmetry of coefficients for one or two channels of input data. Further, the present invention can be extended to N-channels, thus availing maximum resource sharing hardware realization of the Polyphase Interpolation Filter.

BRIEF DESCRIPTION OF THE SEVERAL VIEWS OF THE DRAWINGS

The invention will now be described with reference to and as illustrated by the accompanying drawings.

DETAILED DESCRIPTION OF THE INVENTION

FIGS. 1-5 have been described under the heading 'Background of the Invention'.

The blocks obtained in a generalized structure according to one embodiment of the instant invention are hereby described with reference to the input/output parameters for a polyphase FIR filter.

Figure 6:
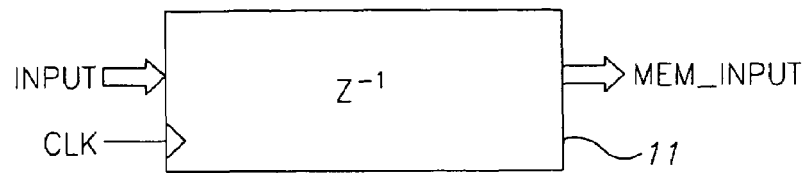
FIG. 6 illustrates an input-interface block of one embodiment of the invented generalized structure.
Figure 7:
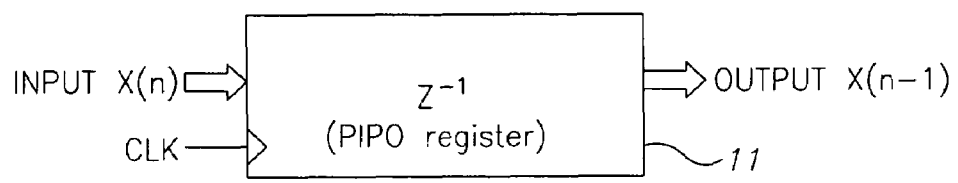
FIG. 7 illustrates a unit sample delay block of one embodiment of the invented generalized structure.

The filter includes an Input Interface (II) Block 16 for synchronizing an input signal to a first internal clock signal. This block 16 comprises a unit sample delay ($Z^{-1}$) 11A as shown in FIG. 6. The size of the delay $Z^{-1}$ determines the input precision of the FIR filter. The unit sample delay 11A is a ParallelIn Parallel Out register (FIG. 7) as it captures the input sample at its positive clock edge. The operation of unit sample delay is evident from the timing diagram shown in FIG. 8.

Figure 8:
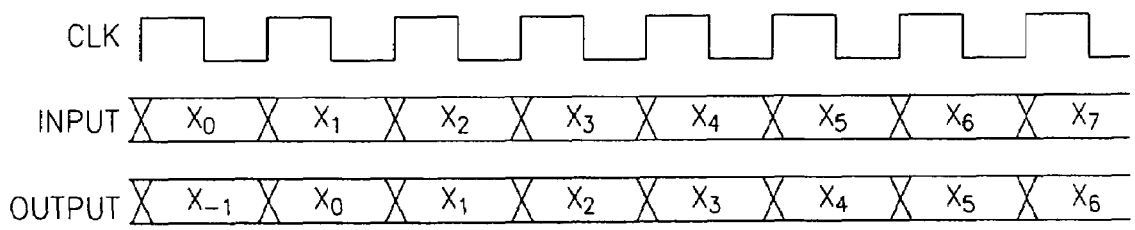
FIG. 8 illustrates the timing diagram to explain working of unit sample delay block in accordance with the invented generalized structure.

The samples X0, X1, X2 - - - Xn, at the input of unit sample delay, in FIG. 8 are delayed by one clock (Clk) cycle as they were captured by the next positive edge of the clock.

Figure 9:
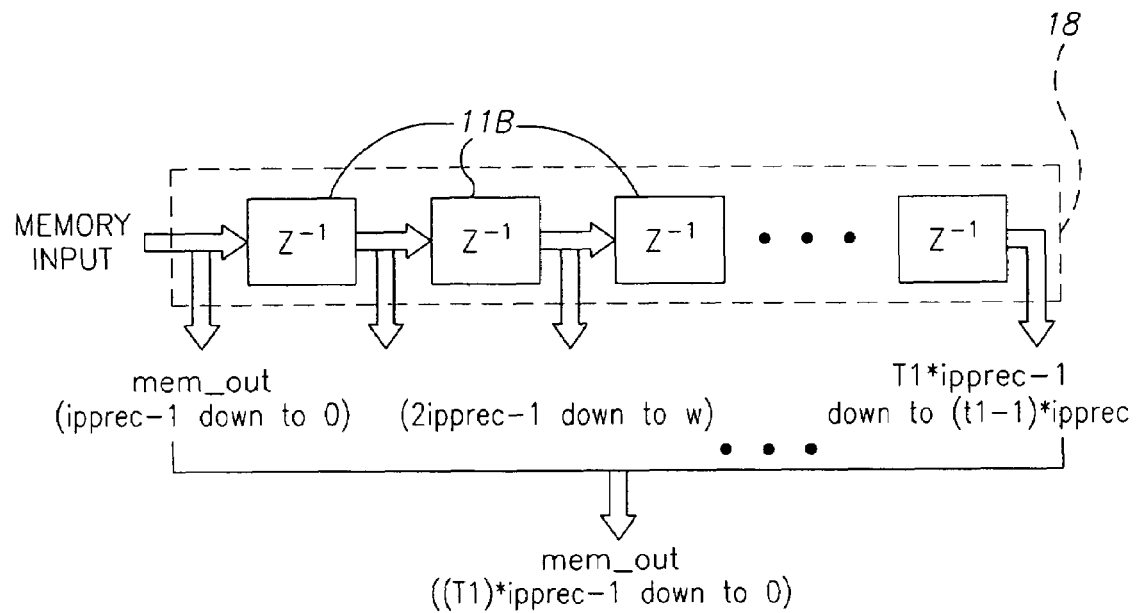
FIG. 9 illustrates the memory block in accordance with one embodiment of the invented generalized structure.

The filter also includes a Memory (M) Block 18 connected to the output of the input interface block for providing multiple delayed output signals in response to the synchronized input signal and the first internal clock signal (FIG. 9). This block 18 comprises a plurality of unit sample delays 11B (T1 in number) are connected to each other, where T1 is the length of the filter and iprec is the wordlength of the memory (input precision). The outputs of the unit sample delays are grouped together to form an output array (mem_out).

Figure 10:
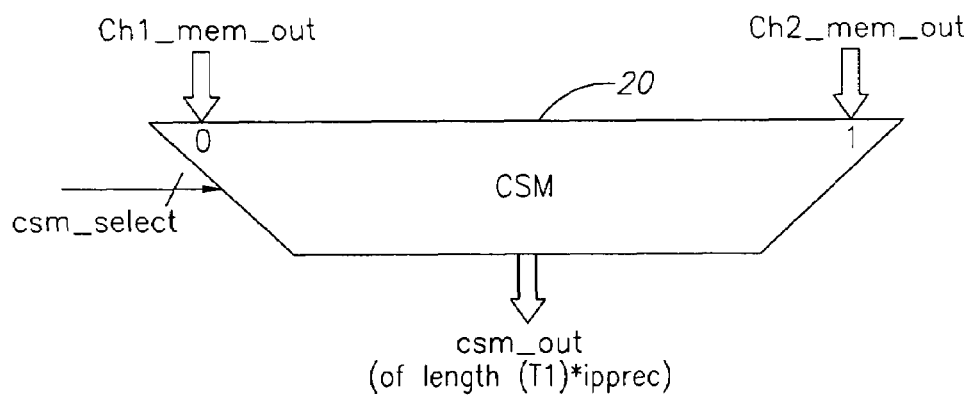
FIG. 10 illustrates the Channel Select Multiplexer (CSM) block in accordance with one embodiment of the invented generalized structure.
Figure 11:
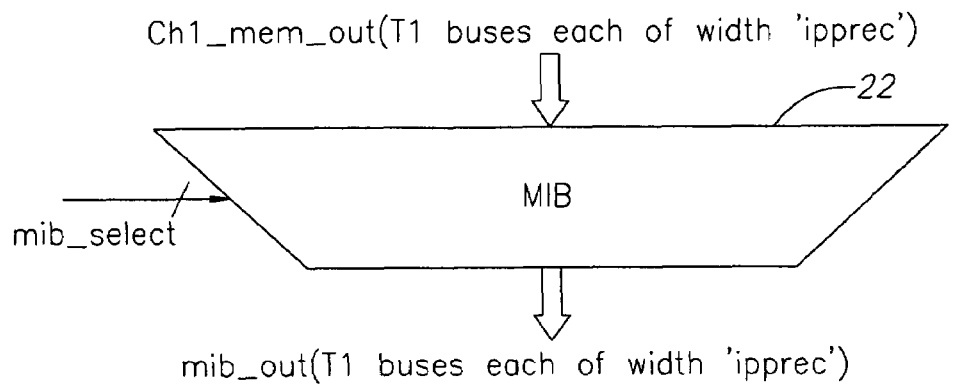
FIG. 11 illustrates the Multiplexer Input-interface Block (MIB) according to one embodiment of the invented generalized structure.

In stereo embodiments, the filter also includes a Channel Select Multiplexer (CSM) Block 20 which receives the synchronized output signals from the memory block of each channel and selects a channel in response to a first set of internal control signals. The Block diagram of the CSM 20 is shown in FIG. 10. This block is used to select a channel for a 2-L-FIR filter. The bus width of the channels Ch1_mem_out and Ch2_mem_out equals (T1)*iprec. The operation of this block is further illustrated by the following table.

TABLE A

Truth table for CSM

| Csm_select | Csm_out |
|---|---|
| 0 | Ch1_mem_out |
| 1 | Ch2_mem_out |

Figure 1:
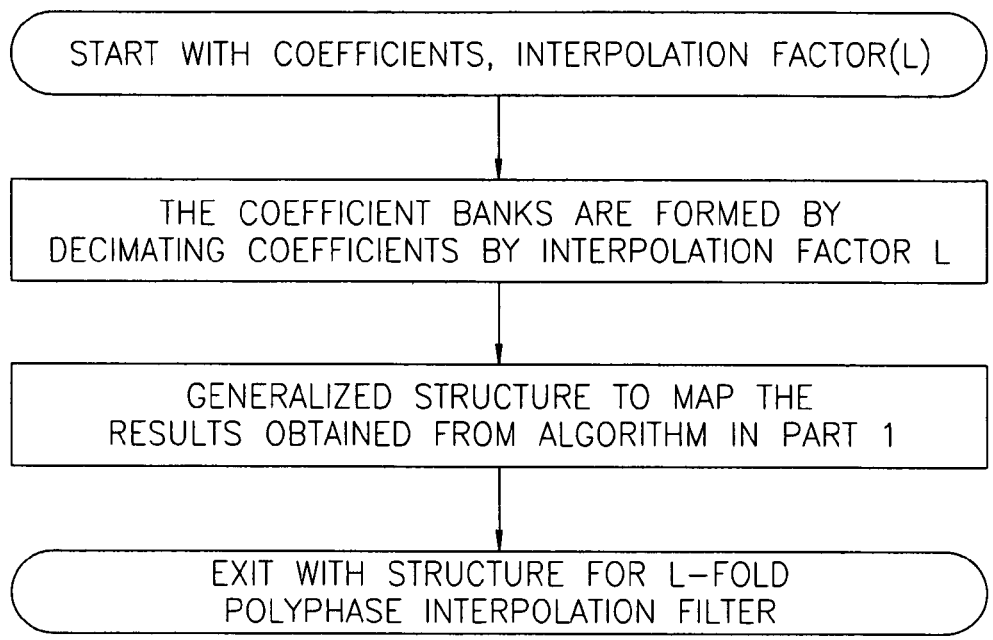
FIG. 1 illustrates a prior art method to realize L-fold polyphase interpolation filter.
Figure 2:
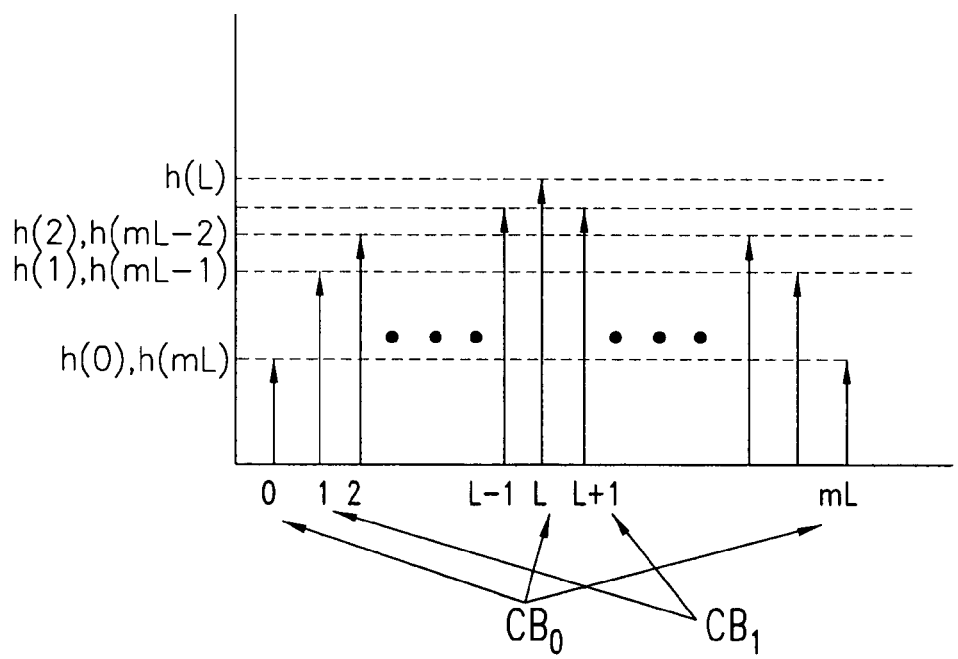
FIG. 2 illustrates the graphical results according to the prior art method after determining the coefficient banks for L-fold polyphase interpolation filter.
Figure 3:
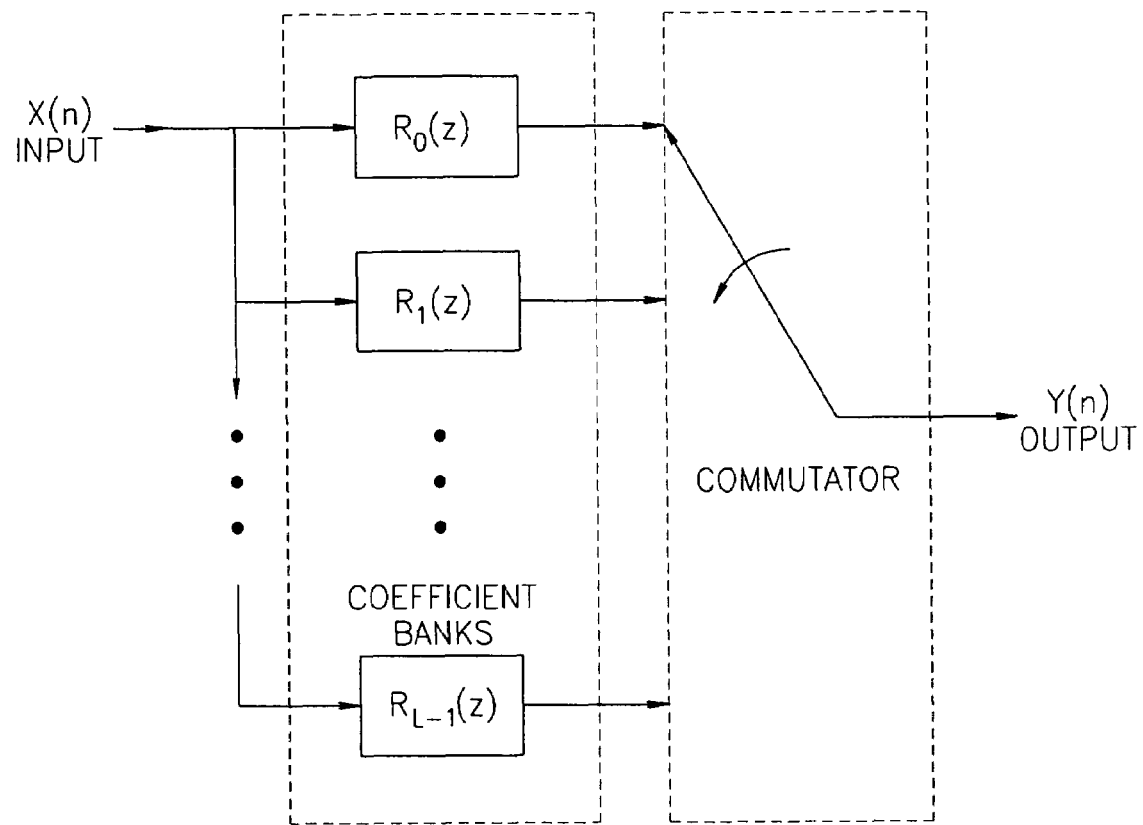
FIG. 3 illustrates the prior art generalized structure for L-fold polyphase interpolation filter.
Figure 4:
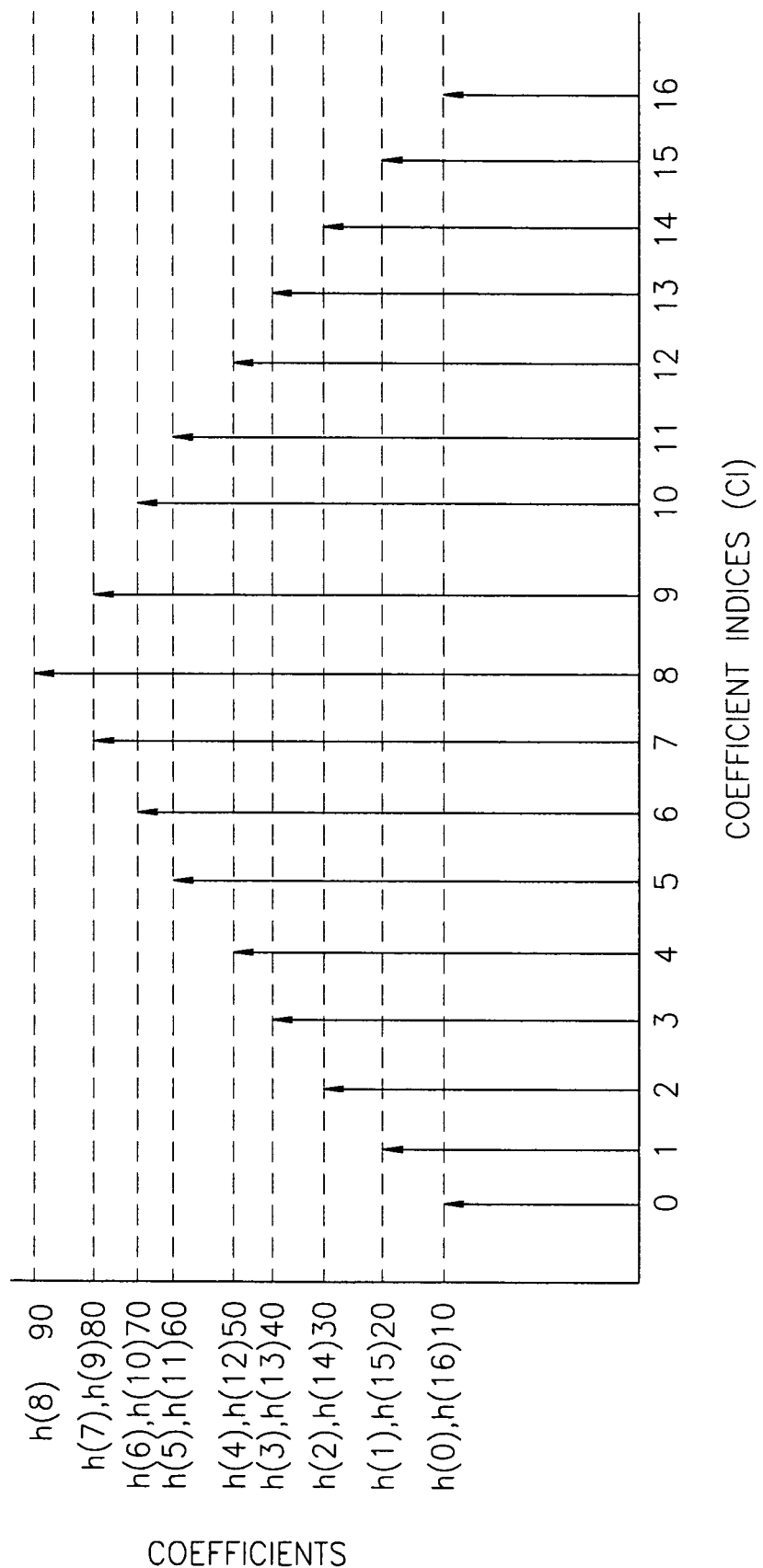
FIG. 4 illustrates the graphical results according to the prior art method after determining coefficient banks for FIR filter polyphase implementation for a given set of data.

The filter also includes a Multiplexer input-interface (MIB) Block 22 which in stereo embodiments is connected to the CSM 20 for receiving input from the output channel csm_out. In mono embodiments that do not use the CSM 20, the MIB 22 is connected to the memory outputs of the memory block 18. In either arrangement, the MIB 22 outputs a plurality of signals for generating mirror image coefficient values in response to a second set of internal control signals (mib_select). The Block diagram of MIB 22 is shown in FIG. 1(*d*). This block is used to generate the mirror image coefficient values for optimal coefficient bank realization. The operation of this block is further illustrated by the following table.

TABLE B

Truth table for MIB

| Mib_select | Mib_out |
|---|---|
| 0 | Ch1_mem_out(T1 − 1 down to 0) buses each of width 'ipprec' |
| 1 | Ch1_mem_out(0 down to T1 − 1) buses each of width 'ipprec' |

Here, 'ipprec' is the input precision signal that is generated as a control signal for the Input Interface (II) block 16.

Figure 12:
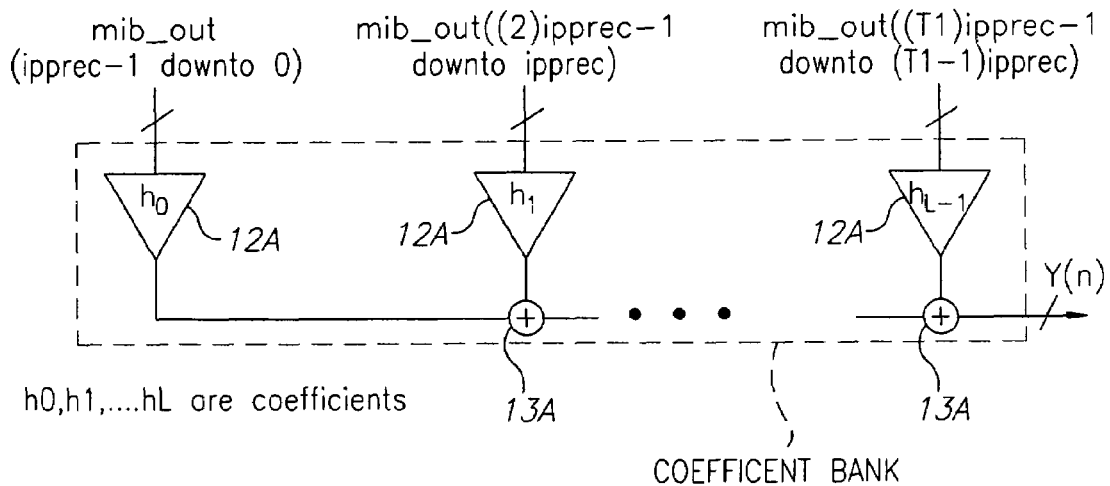
FIG. 12 illustrates the Coefficient Bank (CB) block according to one embodiment of the invented generalized structure.

The filter also includes a Coefficient Block (CB) 24 that receives the signals output by the MIB 22, generates mirror image coefficient sets and/or symmetric coefficient sets, and outputs a plurality of filtered signals by performing multiplication and addition on a set of coefficient inputs and the MIB output signals This block 24 is implemented with multipliers 12A and adders 13A (FIG. 12). It is formed by connecting a plurality of parallel multipliers 12A with a plurality of parallel address/subtractors 13A. The parallel multiplier 12A takes an input say x (n) which if of 'ipprec' bits and multiplies it with the coefficient 'h0' of 'h' bits and gives the output x (n)*h0, of 'ipprec+h' bits. The parallel adder 13A take two inputs 'a', 'b' and give an added output 'y=a+b' of these inputs. The first adder 13A receives its inputs from the first two multipliers 12A, and the subsequent adders 13A receive one input from one of the multipliers and a second input from the prior adder. The output of the coefficient block is received from a final adder 13A.

Figure 13:
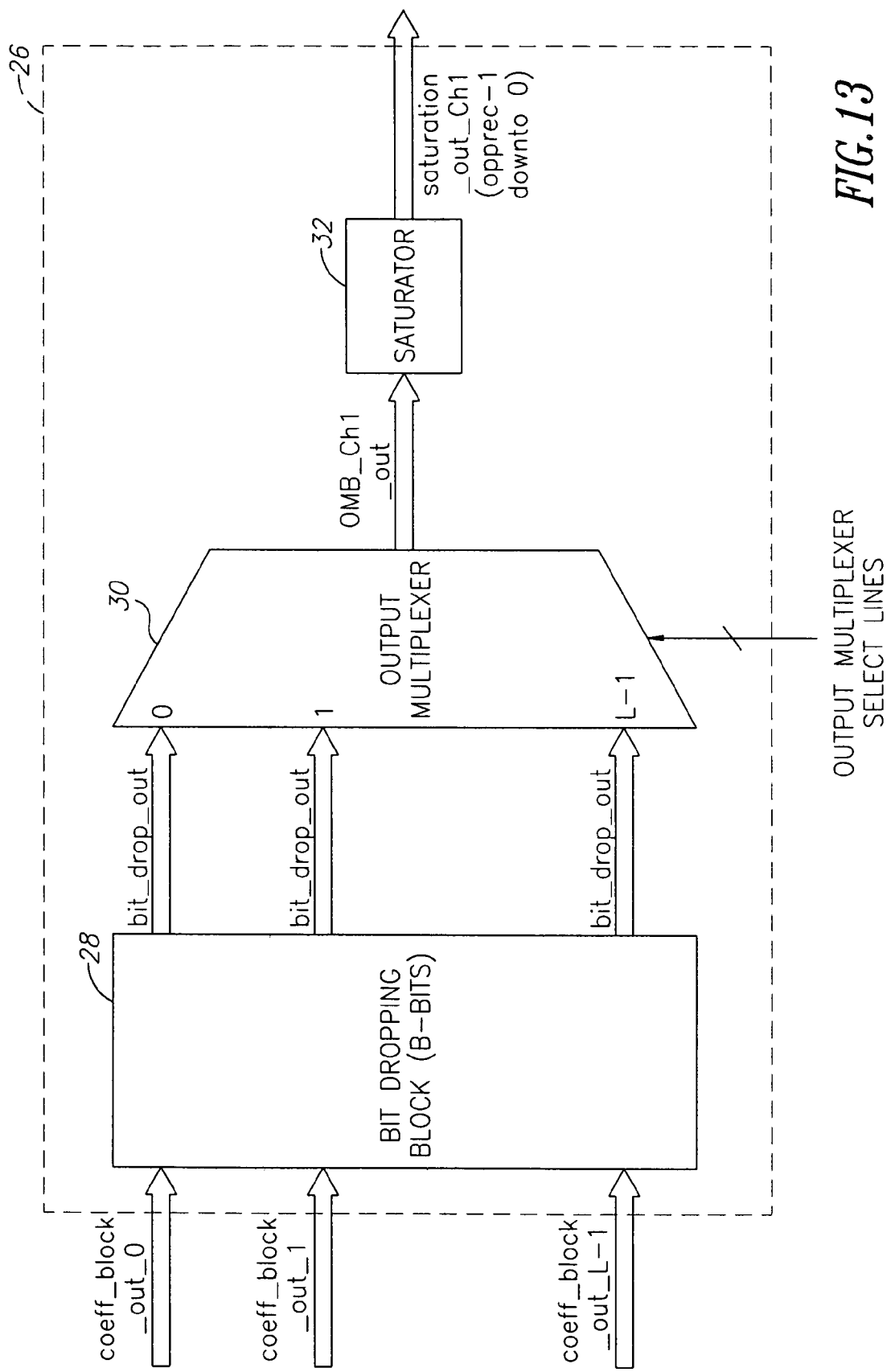
FIG. 13 illustrates the Output Multiplexer Block (OMB) block according to one embodiment of the invented generalized structure.

The filter also includes an Output Multiplexer Block (OMB) 26 that is connected to the coefficient block 24 and controls the gain in the filtered signals. The OMB also selects a signal from the filtered signals and controls the number of bits in the signal, thereby generating a filtered output signal in response to a third set of internal control signals (output multiplexer select lines). The structure of this block 26 is shown in FIG. 13. It consists of three sub blocks: a bit dropping block (BDB) 28, an Output Multiplexer (OM) 30, and a Saturator (S) 32. Assuming that gain be 'G' bits for the example coefficient bank implementation under consideration. There are 'W' coefficient banks each with different set of coefficients in 1-L-FIR or 2-L-FIR filter. The Bit Dropping block 28 receives in 'ipprec+G' bits of each coefficient bank and drops the specified number of bits 'B' from LSB side (G+ipprec−1 down to 0). The output of bit dropping block 28 is a bus of length 'ipprec+G-B' bits for each coefficient bank, each output of sub-block BDB 28 is connected to corresponding coefficient bank input in sub-block OM 30 for selecting a coefficient bank from a given set of coefficient banks. The operation of the Output Multiplexer Block 30 is further described in Table C.

TABLE C

Truth table for Output Multiplexer

| Output multiplexer select lines | OMB_Ch1_out |
|---|---|
| 0 | bit_drop_out((G + ipprec − 1 − B) downto 0) |
| 1 | bit_drop_out(2(G + ipprec − 1 − B) downto G − B) |
| ... | ... |
| ... | ... |
| L − 1 | bit_drop_out(L(G + ipprec − 1 − B) downto(L − 1)(G + ipprec − B)) |

The operation of the saturator block 32 is described with reference to an example as given below.

Suppose we have a three bit output from the OM block 30 and the end user requires a two bit output; the required output variable is defined as output precision variable (opprec=2). This needs saturation at the output that is further illustrated with the help of the following example.

2's complement representation of three bit numbers:

3—011, 2—010, 1—001, 0—000, −1—111, −2—110, −3—101, −4—100.

Figure 14:
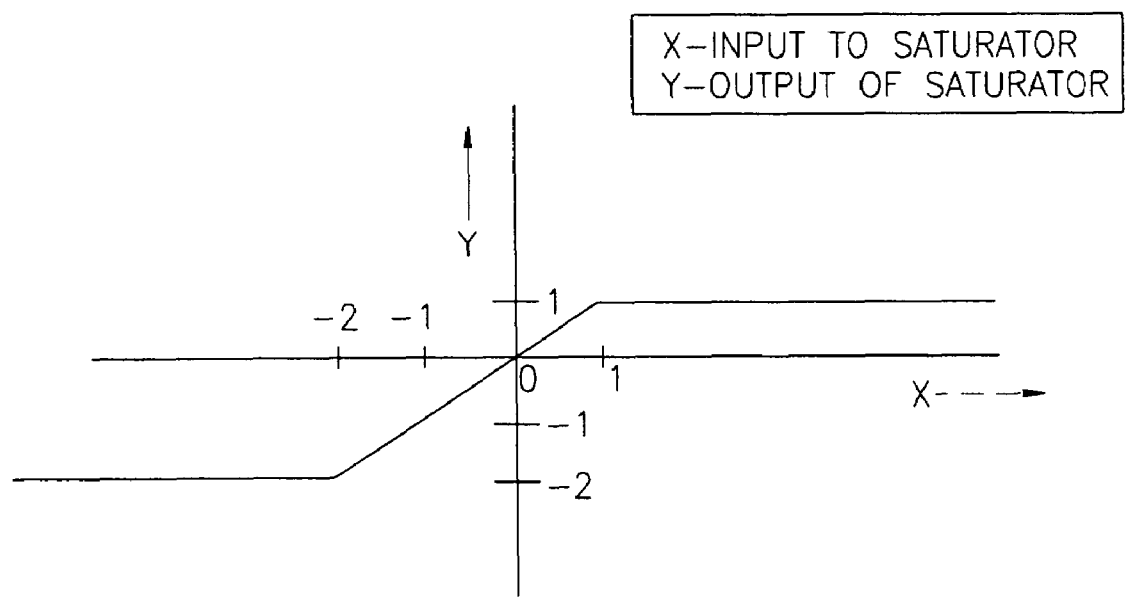
FIG. 14 illustrates the transfer function of a saturator block according to one embodiment of the invented generalized structure.

If these numbers are required to be saturated to 2 bits, then the MSB and MSB−1 of the given number are checked. If both the bits are same, then these numbers are converged to −1, −2 or 1,0 respectively by removing the MSB. If MSB and MSB−1 of the number are different, then converge the number −3 to −2, −4 to −2, 3 to 1,2 to 1 respectively. The transfer function of the above described saturation block is shown in FIG. 14.

Figure 15:
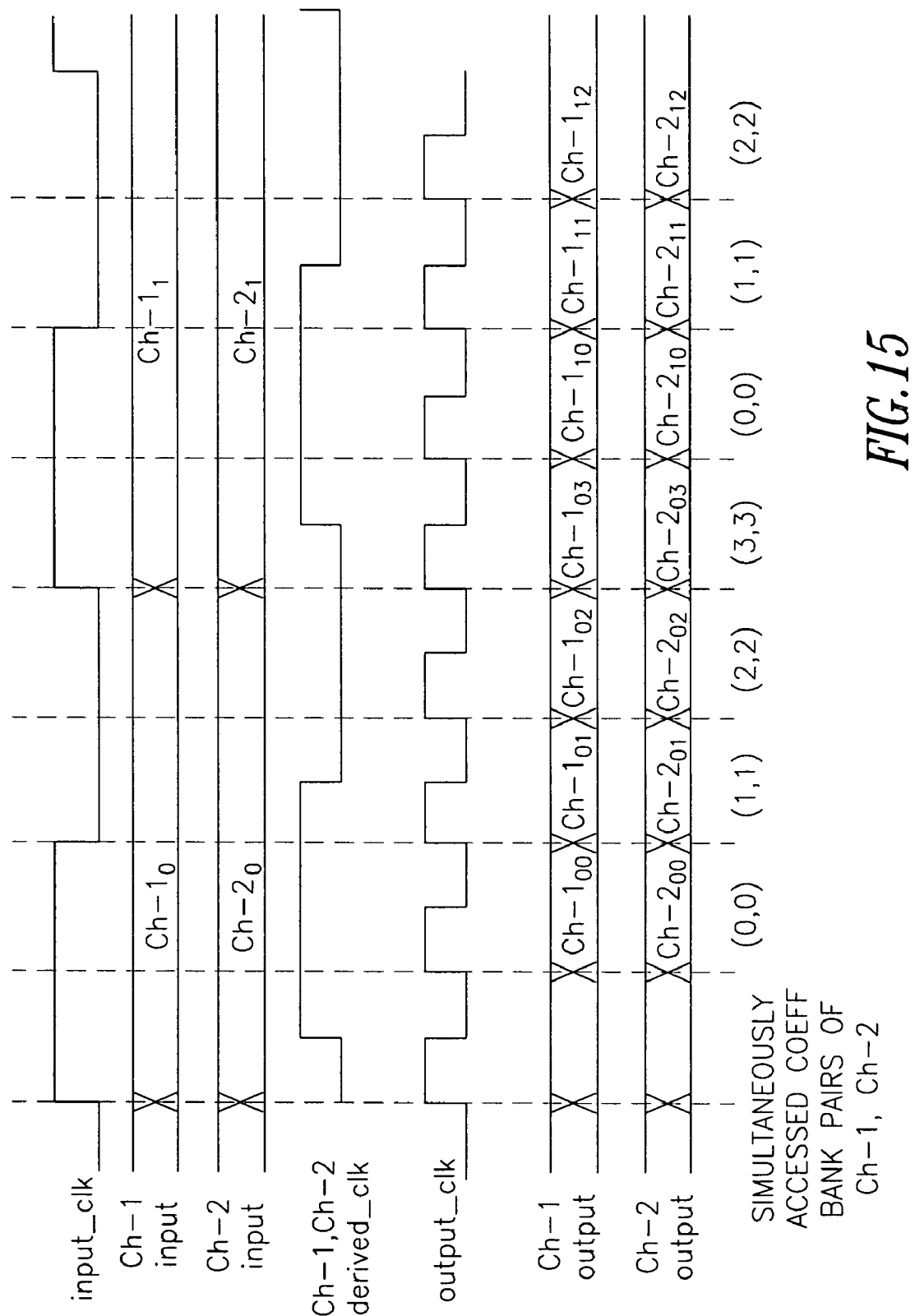
FIG. 15 illustrates the timing diagram of an existing FIR filter without delay between the channel inputs.
Figure 16:
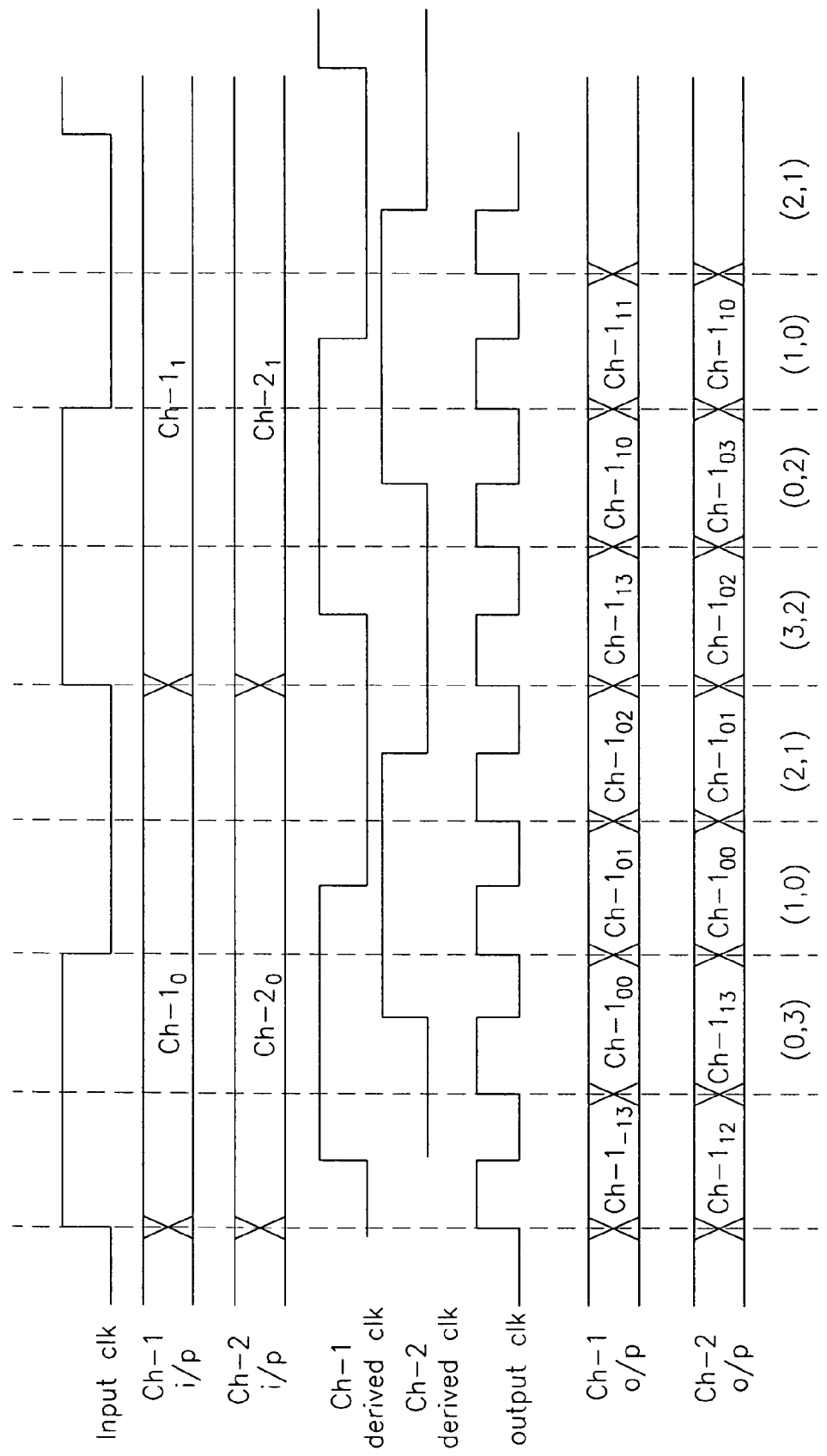
FIG. 16 illustrates the timing diagram of FIR filter with delay between the channel inputs in accordance with one embodiment of the instant invention.

Delay between input of two channels helps in optimal use of the coefficient banks (avoids duplication of coefficient banks). The delay between channels is zero as illustrated in the timing diagram in FIG. 15, thus simultaneous access of coefficient banks is required that results inefficient coefficient bank realization. It is observed from the timing diagram that 6 coefficient banks need to be implemented. The method according to one embodiment of the instant invention will induce a delay of one clock cycle between channel 2 and channel 1 as shown in timing diagram of FIG. 16. Thus, it is observed that simultaneous access of the same coefficient banks is prevented and the coefficient bank corresponding to same Coefficient Index is not accessed simultaneously (Ch-1o/p & Ch-2 o/p timing diagram).

The introduction of delay between channels may induce delay in the ideal FIR filter parameters; such as the operating frequency characteristics. In order to obtain ideal filter characteristics, delay equalization can be achieved by introducing an Output Register block 34 (See FIGS. 18-21) that is elaborated as follows.

Output Register (OR): Output registers are used to capture the data from the saturator Block 32 as well as to synchronize the output data of all the channels. Output registers are formed by connection of plurality of unit sample delays. Number of output registers needed for each channel would depend on the delay between channels, which is illustrated by the table given below.

TABLE 1

Output registers

| Delay | Number of output registers in each channel |
|---|---|
| 1 | 2 on channel 1, 1 on channel 2 |
| 2 | 3 on channel 1, 1 on channel 2 |

The filter also includes a Control Block 36 for controlling the other blocks of the filter (See FIGS. 18-21). This block generates signals for MIB & CSM of 1-L-FIR filter in such a way that the switching speed of mirror image coefficient banks is twice of the switching speed of the symmetric coefficient banks.

Figure 17:
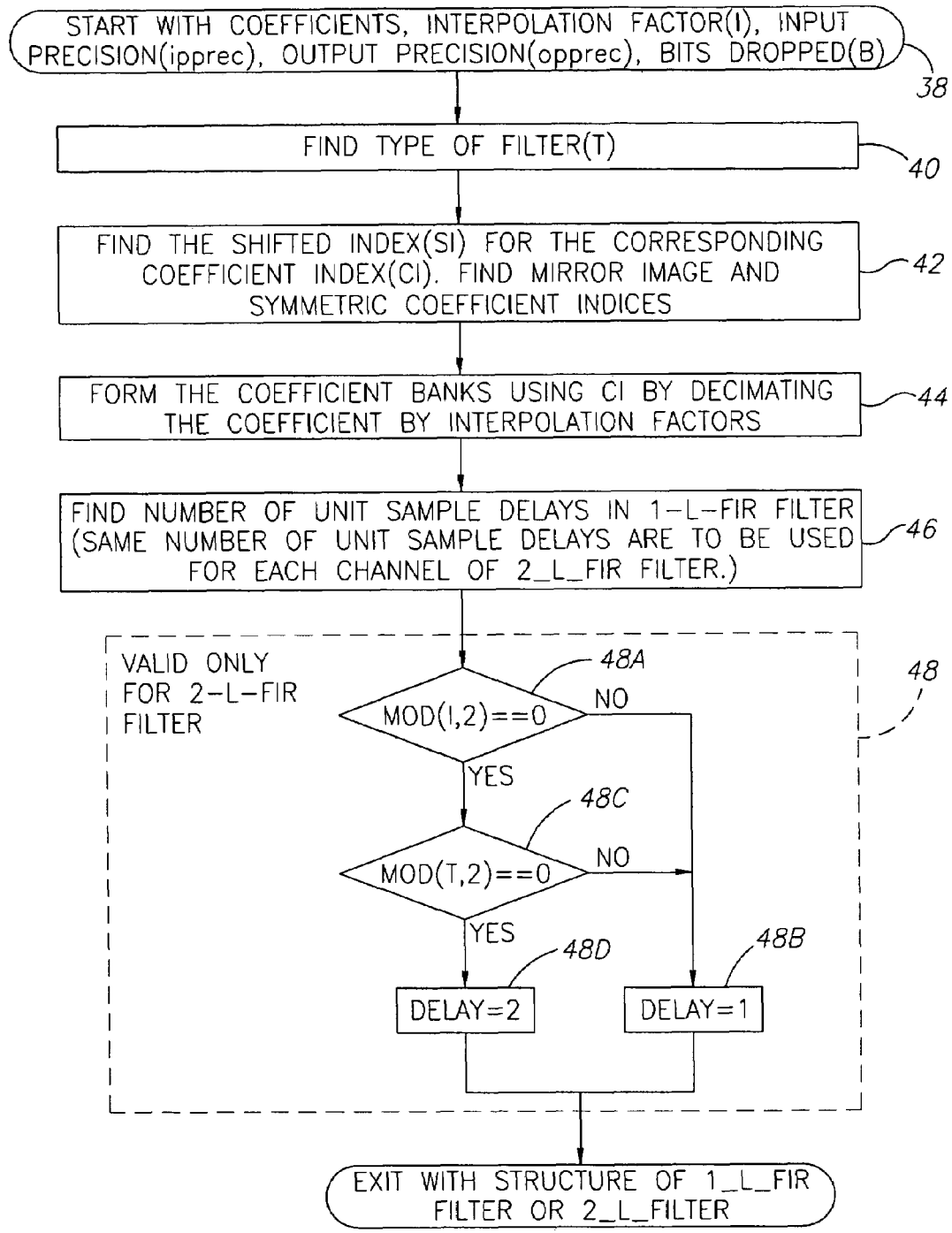
FIG. 17 illustrates the method in accordance with one embodiment of the instant invention for implementing 1-L-FIR filter or 2-L-FIR filter.

FIG. 17 illustrates the flow diagram of one embodiment of the invented method to realize 1-L-FIR/2-L-FIR filters. Given the coefficients, interpolation factor (I), input precision (ipprec), output precision (opprec) and number of bits dropped (B) in step 38, the method will realize the hardware structure for the 1-L-FIR/2-L-FIR filters. The method determines properties like, mirror images and symmetric coefficient indices of the FIR filter, number of coefficient taps and delay between channel inputs of the 1-L-FIR filter. The results of the method are mapped onto the target device to result in the generalized structure according to one embodiment of the instant invention.

The method is discussed with reference to certain terms pertaining to the polyphase filter realization.

Coefficient Indices (CI)—These are the indices of the starting element of the L coefficient banks of the 1-L-FIR. The notation of CI's for 1-L-FIR filter is 0, 1, ... L−1.

Shifted Indices (SI)—These are the new indices given to the CI to determine mirror image and symmetric coefficient banks.

Delay between channels is further elaborated with reference to a stereo-channel filter, and the introduction of delay by the method shown in FIG. 17 is hereby discussed. It indicates the difference in inputs in terms of output clock period between channels so as to have optimal use of the coefficient banks (to avoid duplication of coefficient banks).

The method uses the Interpolation factor and Length of the filter to find the number of taps, for thereby determining coefficient indices of mirror images, symmetric coefficient banks of 1-L-FIR filter; and delay between two channels. The method does not require coefficient banks of the 1-L-FIR filter to be formed to determine the mirror image and symmetric coefficient banks. Hence, the method is efficient as compared to the existing algorithm.

The method is discussed with reference to an example of 1-L-FIR filter:

Inputs required for the design of the 1-L-FIR filter are given by:

Interpolation factor (I)=4,
Length of the filter (L1)=17,
Coefficient set={10, 20, 30, 40, 50, 60, 70, 80, 90, 80, 70, 60, 50, 40, 30, 20, 10}
Gain of each coefficient Block (G)=9
Bits dropped at the output of the filter in OMB (B)=7 bits,
Input precision (ipprec)=10 bits,
Output precision (opprec)=10 bits. (assumed for the example)

Following are the steps of execution of the method that are discussed with reference to FIG. 17.

In step 40, the method finds the type of the filter (T), where the type of the filter is determined by T=Mod (L1, I), where L1 is length of the N-L-FIR filter, I is the interpolation factor. The type of the Filter is used to find symmetric and mirror image Coefficient Indices.

For the example under consideration, the type of the filter is given by:

T=Mod (L1, I)=Mod (17,4)=1.

In step 42, the method finds the Shifted Index (SI) for the corresponding Coefficient Index (CI) followed by determining mirror image and symmetrical coefficient indices. The following sub-steps are performed for determining the Shifted Indices for the corresponding Coefficient Indices.

Step 42.1: This step computes the Shifted Indices for CI='T' to 'I−1'. The value SI='1' is given to CI='T' and 'I−1', SI='2' is given to CI='T+1' and 'I−2', SI is incremented in forward direction of CI=T+1, and in back ward direction of CI=I−2. The SI sequence converges to K as shown in Case (i,iii), or will converge to 'K−1','K','K−1' as shown in Case (ii,iv) further in the description.

Step 42.2: This step computes the Shifted Indices from CI='O' to 'T−1'. SI='K+1' is given to CI='0' and 'T−1' and, SI='K+2', is given to CI='1' and 'T−2', SI is incremented in forward direction of CI=1, and in back ward direction of CI=I−2. The SI sequence will converge to W, W as in Case (i,iii) or to 'W−1','W','W−1' as shown in Case (ii,iv). The shifted indices for the corresponding CI are given in Tables 2, 3, 4, and 5.

Case (i): When I−1−T is even, T−1 is even;

$K=\text{floor}((I-1-T)/2)+1$, $W=\text{floor}((T-1)/2)+K+1$

TABLE 2

Shift Index (Case (i))

| CI | 0 | 1 | . | . | . | T−2 | T−1 | T | T+1 | T+2 | . | . | . | I−3 | I−2 | I−1 |
|---|---|---|---|---|---|---|---|---|---|---|---|---|---|---|---|---|
| SI | K+1 | K+2 | . | W | W | . | K+2 | K+1 | 1 | 2 | . | . | K | K | . | . | 2 | 1 |

Case (ii): When I−1−T is odd, T−1 is even;

$K=\text{floor}((I-1-T)/2)+1$ $W=\text{floor}((T-1)/2)+K+1$

TABLE 3

Shift index (Case (ii))

| CI | 0 | 1 | . | . | . | T-2 | T-1 | T | T+1 | T+2 | . | . | . | I-3 | I-2 | I-1 |
|----|---|---|---|---|---|-----|-----|---|-----|-----|---|---|---|-----|-----|-----|
| SI | K+1 | K+2 | . | W | W | . | K+2 | K+1 | 1 | 2 | . | K-1 | K | K-1 | . | 2 | 1 |

Case (iii): When I−1−T is even, T−1 is odd;

$K = \text{floor}((I-1-T)/2)+1$, $W = \text{floor}((T-1)/2)+K+1$

TABLE 4

Shift index (Case (iii))

| CI | 0 | 1 | . | . | . | T-2 | T-1 | T | T+1 | T+2 | . | . | . | I-3 | I-2 | I-1 |
|----|---|---|---|---|---|-----|-----|---|-----|-----|---|---|---|-----|-----|-----|
| SI | K+1 | K+2 | W-1 | W | W-1 | K+2 | K+1 | 1 | 2 | . | . | K | K | . | 2 | 1 |

Case (iv): When I−1−T is odd, T−1 is odd;

$K = \text{floor}((I-1-T)/2)+1$, $W = \text{floor}((T-1)/2)+K+1$

TABLE 5

Shifted index(Case(iv))

| CI | 0 | 1 | . | . | . | T-2 | T-1 | T | T+1 | T+2 | . | . | . | I-3 | I-2 | I-1 |
|----|---|---|---|---|---|-----|-----|---|-----|-----|---|---|---|-----|-----|-----|
| SI | K+1 | K+2 | W-1 | W | W-1 | K+2 | K+1 | 1 | 2 | . | K-1 | K | K-1 | . | 2 | 1 |

The algorithm states that the Coefficient Indices which are having the same Shifted Index are mirror images and the Coefficient Indices with unique Shifted Index are symmetric coefficient banks. Number of coefficient banks formed are W in number.

Here, the above algorithm is discussed with reference to the previous example. For this example CI's are {0, 1, 2, 3}, as the Interpolation factor=4. The Type of the filter is computed as follows.

T=Mod (L1, I)=Mod (17,4)=1;

The method of FIG. 17 is further elaborated by the Tables 6, 7 & 8.

SI=1 is new index given to CI=1 and 3 (as shown in table below).

TABLE 6

| CI | 0 | T = 1 | 2 | I − 1 = 3 |
|----|---|-------|---|-----------|
| SI |   | 1     |   | 1         |

SI=2 is new index given to CI=2, as SI need to be incremented in the direction of CI=2(T+1) and 2(I−1) (as shown in table below)

TABLE 7

| CI | 0 | 1 | 2 | 3 |
|----|---|---|---|---|
| SI |   | 1 | 2 | 1 |

SI=3 is new index given to CI=0.

TABLE 8

| CI | 0 | 1 | 2 | 3 |
|----|---|---|---|---|
| SI | 3 | 1 | 2 | 1 |

Table 8 indicates that the coefficient banks with coefficient indices (1,3) are mirror images as CI=1,3 have same SI (1). While CI=0,2 have unique SI (2,3) so they result in symmetric coefficient banks. Due to the mirror images (coefficient indices 1, 3 are same), thus it is observed from the description of the table that three coefficient banks need to be implemented (1,3 being mirror images) instead of four.

In step 44, the method forms the coefficient banks by using Coefficient Indices by decimating the coefficients by interpolation factors. The following coefficient set is taken as an example for illustrating the execution of this step.

Coefficient set={10, 20, 30, 40, 50, 60, 70, 80, 90, 80, 70, 60, 50, 40, 30, 20, 10}

First coefficient bank is formed by using CI=0 and picking the coefficients CI+4, CI+8, CI+12, CI+16. The process is repeated for CI=1, CI=2, which results in the following sets of coefficient banks.

CB0={10,50,90,50,10}

CB1={20,60,80,40}

CB2={30,70,70,30}

In step 46, the method finds the number of unit sample delays in memory for the 1-L-FIR filter. The number of unit sample delays is determined by applying the formula; Ceil (Float(L1)/Float(I))−1.

In step 48, the method determines the delay between channels for 2-L-FIR filter (N>=2) (Delay is based on Interpolation Factor (I) and Type (T) as shown in FIG. 17). The step 48 includes a sub-step 48A which determines whether the interpolation factor I is even (i.e., whether I modulo 2 equals 0). If not, then the method determines that the delay is one in sub-step 48B. If I is even, then the method determines in sub-step 48C whether the filter type T is even (i.e., whether T modulo 2 equals 0). If so, then the method determines that the delay is two in sub-step 48D; else the delay is one as determined in sub-step 48B. For the FIR filter with the given coefficient set, having I=4 and T=1, the calculated delay is equal to one clock cycle.

Thus, it is observed from the above stated steps that the coefficient bank implementation is minimized in the structural realization of the 1-L-FIR/2-L-FIR filter. The overhead in this implementation would be Channel Select Multiplexer (CSM) with each coefficient bank, and one extra delay register on the output of Channel 1 for synchronization with Channel 2 output. The minimization of the coefficient banks is significant for efficient filter realization as compared to the overheads in the instant implementation.

The generalized structure according to one embodiment of the instant invention is hereby discussed. The structure for 1-L-FIR filter is explained with reference to FIG. 18.

The Input Interface block (II) 16 is an interface between the input and the memory (M) 18, and is used for delay induction (stereo channel filter) and synchronization between input coefficients. The memory (M) 18 is formed with unit sample delays required to store the samples. The number of unit sample delays in memory are given in row 1 of the Table 9. The coefficient banks 24A . . . 24X resulting from the algorithm can be mirror image and symmetric in nature this is evident from the row 2 and 3 of the table 9. The figure further illustrates the data flow between the MIBs 22A . . . 22X, coefficient banks 24A . . . 24X, Control Block 36, OMB 26, and the Output Register block 34. The CSM block 20 is not required for a mono-channel implementation, and the MIB is specific for mirror image coefficient bank generation. The comparison of results for 1-L-FIR filter for existing algorithm and method of FIG. 17 for various parameters is shown in Table 10.

TABLE 10

Comparison of results for 1-L-FIR filter for existing method and method of FIG. 17

|  | Existing algorithm | FIG. 17 algorithm | Gain in terms of hardware blocks | Over head in terms of hardware blocks |
|---|---|---|---|---|
| Coefficient Banks | I (Interpolation Factor) | W (where W = floor((T − 1)/2) + K + 1 and K = floor ((I − 1 − T)/2) + 1, and T = Mod (L1, I) | I − W coefficient bank | — |
| MIB | — | I − W | — | I − W MIB |
| OMB | Number of input buses are I | Number of Input buses are W | Hardware for I − W input bus | — |

TABLE 9

Results obtained from the method of FIG. 17

| S. No | Parameters | Hardware obtained for an example coefficient set. |
|---|---|---|
| 1 | Number of unit sample delays in memory for 1-L-FIR | 4 |
|  | Number of unit sample delays in memory for 2-L-FIR | 8 |
| 2 | CI's of mirror image and symmetric coefficient banks | {0, 1, 2} |
| 3 | Mirror image and symmetric coefficient banks | Mirror image coefficient bank are {h(1), h(5) . . . } symmetric coefficient banks are; {h(0), h(4) . . . } and {h(2), h(6) . . . } |
| 4 | Delay | 1 |

An invented generalized structure for 1-L-FIR filter & 2-L-FIR filter is discussed as follows.

Figure 18:
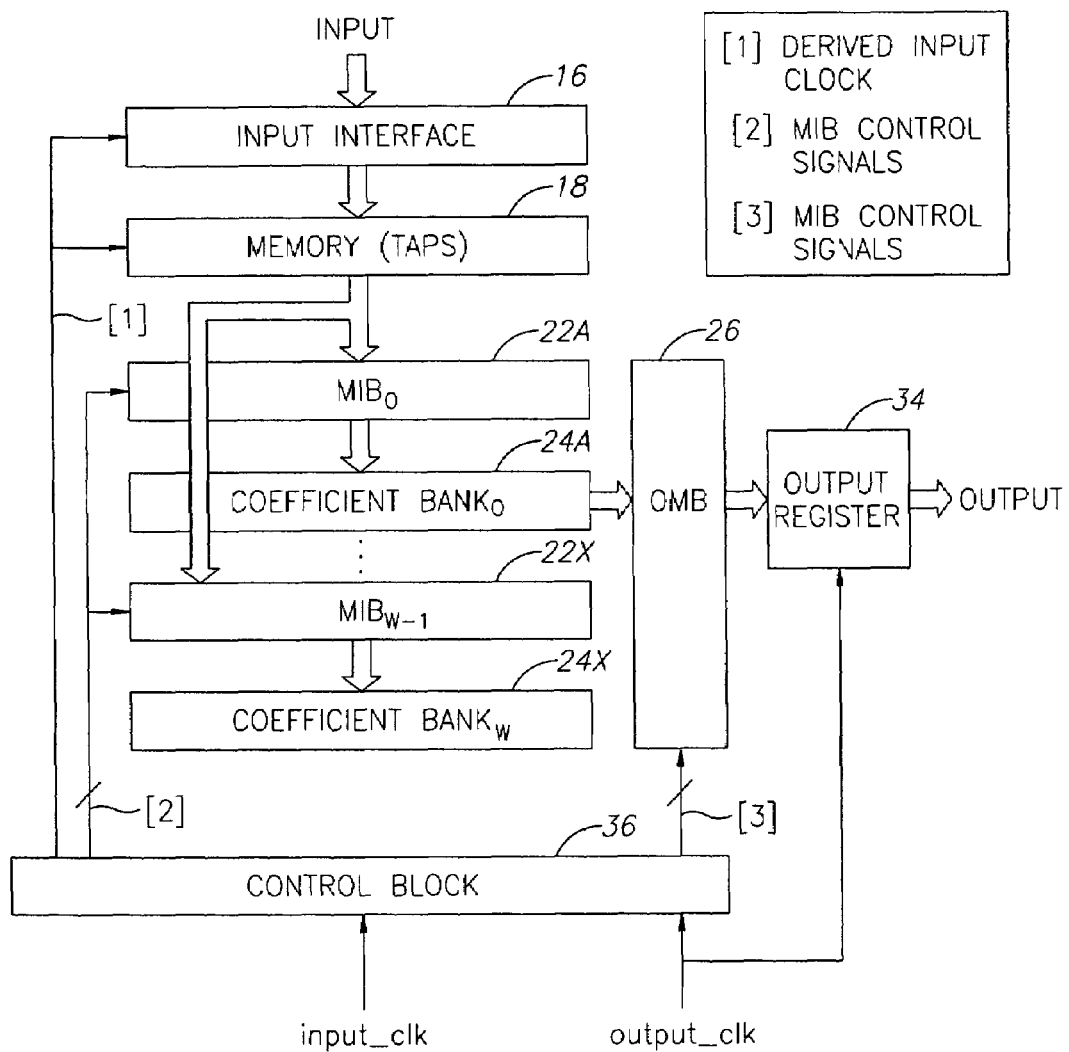
FIG. 18 illustrates the generalized structure of 1-L-FIR filter according to one embodiment of the instant invention.

From the above table it is evident that the hardware minimization in the structure of FIG. 18 is in terms coefficient banks and OMB, and the overhead is in terms of MIB's implemented. In FIG. 18, the input to the filter with bus name 'Input' is connected to the input interface (II) 16, the output of the II 16 is connected to the memory 18, the output of memory 18 is connected to the plurality of Multiplexer Input-Interface Blocks (MIBs) 22A . . . 22X (in absence of a corresponding MIB the output of memory is connected to the corresponding coefficient banks [$CB_0$] to [$CB_{W-1}$]), the outputs of corresponding multiplexer input-interface blocks [$MIB_0$] to [$MIB_{W-1}$] are connected to the corresponding coefficient banks [$CB_0$] to [$CB_{W-1}$], the output's of each coefficient bank [$CB_0$] to [$CB_{W-1}$] is connected to corresponding input of the output multiplexer block (OMB) 26, the output of OMB 26 is connected to the output register (OR) 34, and the 'output' of the 1-L-FIR filter is obtained from the output of the OR 34.

A structure for 1-L-FIR filter according to one embodiment of the invention is discussed as follows.

Figure 19:
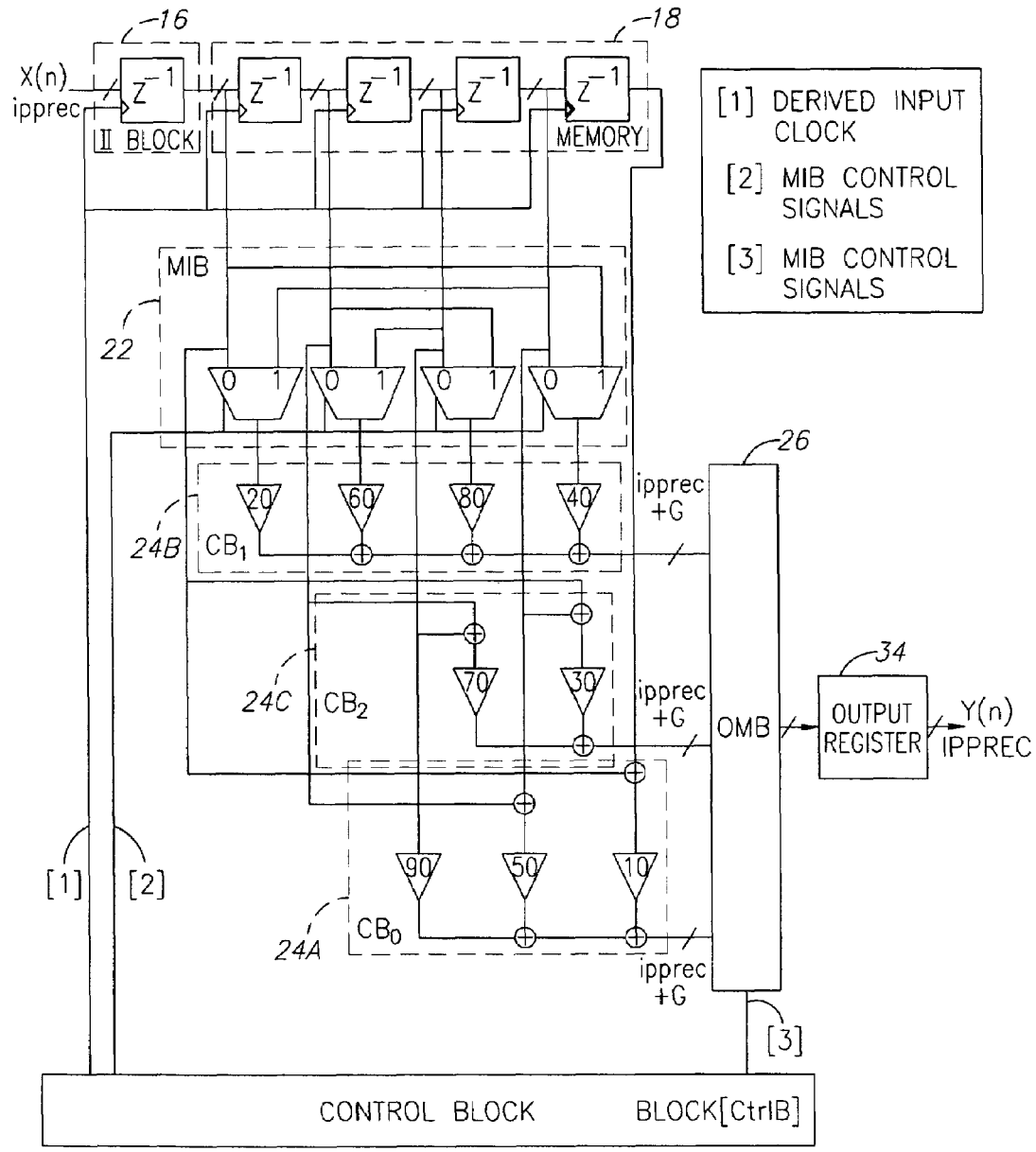
FIG. 19 illustrates the structure of 1-L-FIR filter for a given set of data in accordance with one embodiment of the instant invention.

The 1-L-FIR filter of the example FIR filter is shown in FIG. 19. Referring to Table 9 it follows that the generated structure will have memory with four unit sample delays and one MIB 22 as there is only one mirror image coefficient bank, three coefficient banks (24A-C) are generated as computed in above stated step 42 and tabulated as row 3 of the Table 9. An OMB 26 is generated with three input buses as there are three coefficient banks and an output register. The specifications of each of these blocks is explained below.

For the example, each unit sample delay in FIG. 19 is defined for the input/output parameters; ipprec=10, and G=9 and ipprec+G=19 (the output of coefficient bank). The MIB 22 is generated, with Type of the filter=4 and the OMB block 26 is generated, with G=9 bits, ipprec=10 bits, opprec=10 bits and B=7 bits.

The comparison of results for an 1-L-FIR filter according to the existing structure and the structure of FIG. 19 for the example filter are discussed in the following table.

TABLE 11

| | Existing structure (FIG. 5) | Invented structure (FIG. 19) | Gain in terms of hardware blocks | Over head in terms of hardware blocks |
|---|---|---|---|---|
| Coefficient Banks | 4 | 3 | 1 coefficient bank | — |
| MIB | — | 1 | — | 1 MIB |
| OMB | Number of input buses are 4 | Number of Input buses are 3 | Hardware for 1 input bus | — |

Figure 5:
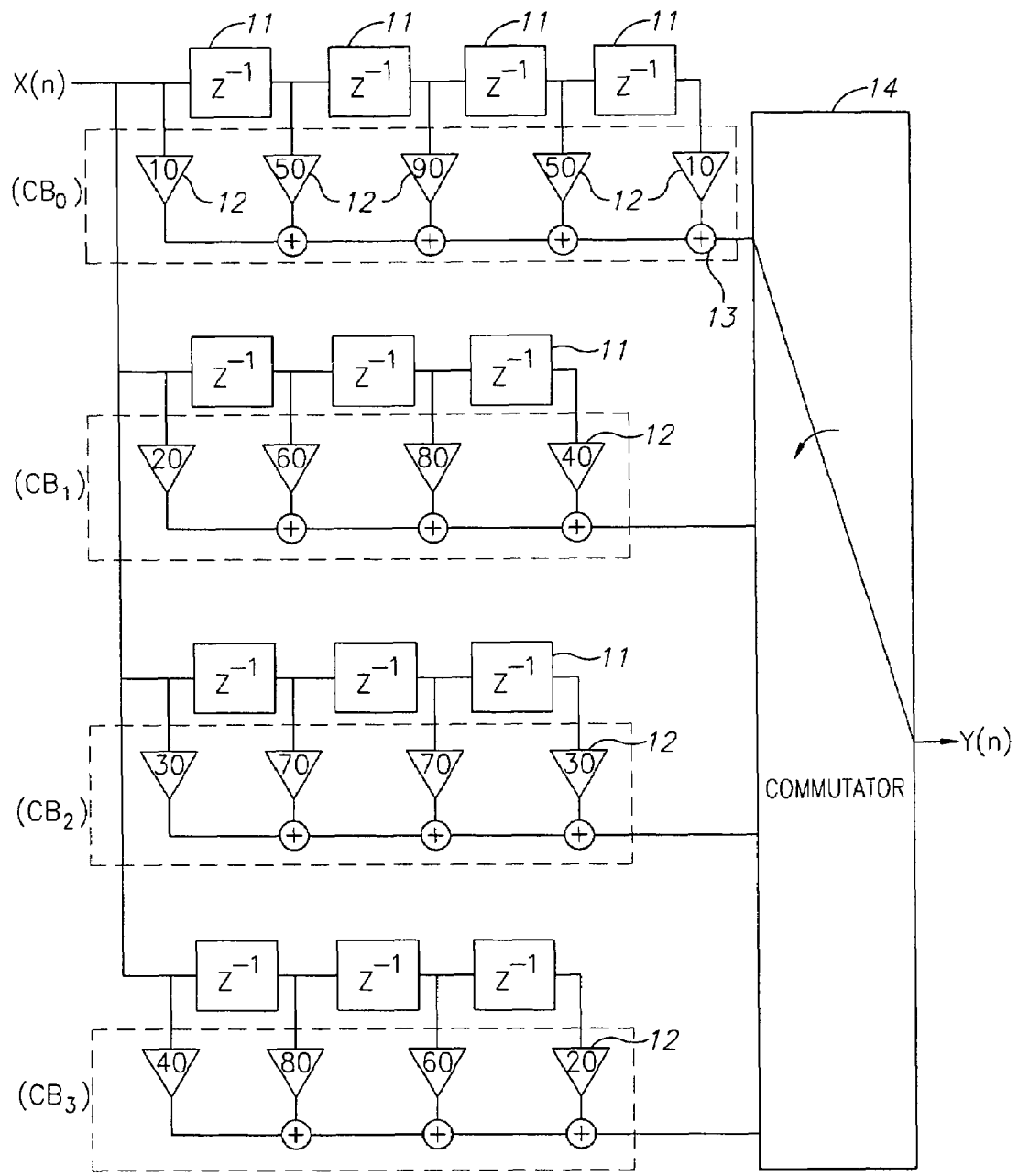
FIG. 5 illustrates the prior art structure for the polyphase implementation of an example FIR filter.

From the Table 11 it is evident that there is hardware gain of 9 unit sample delays, 1 coefficient bank and one input bus in OMB for the structure of FIG. 19 compared to the existing structure (FIG. 5 and the over-head involved is 1MIB.

Figure 20:
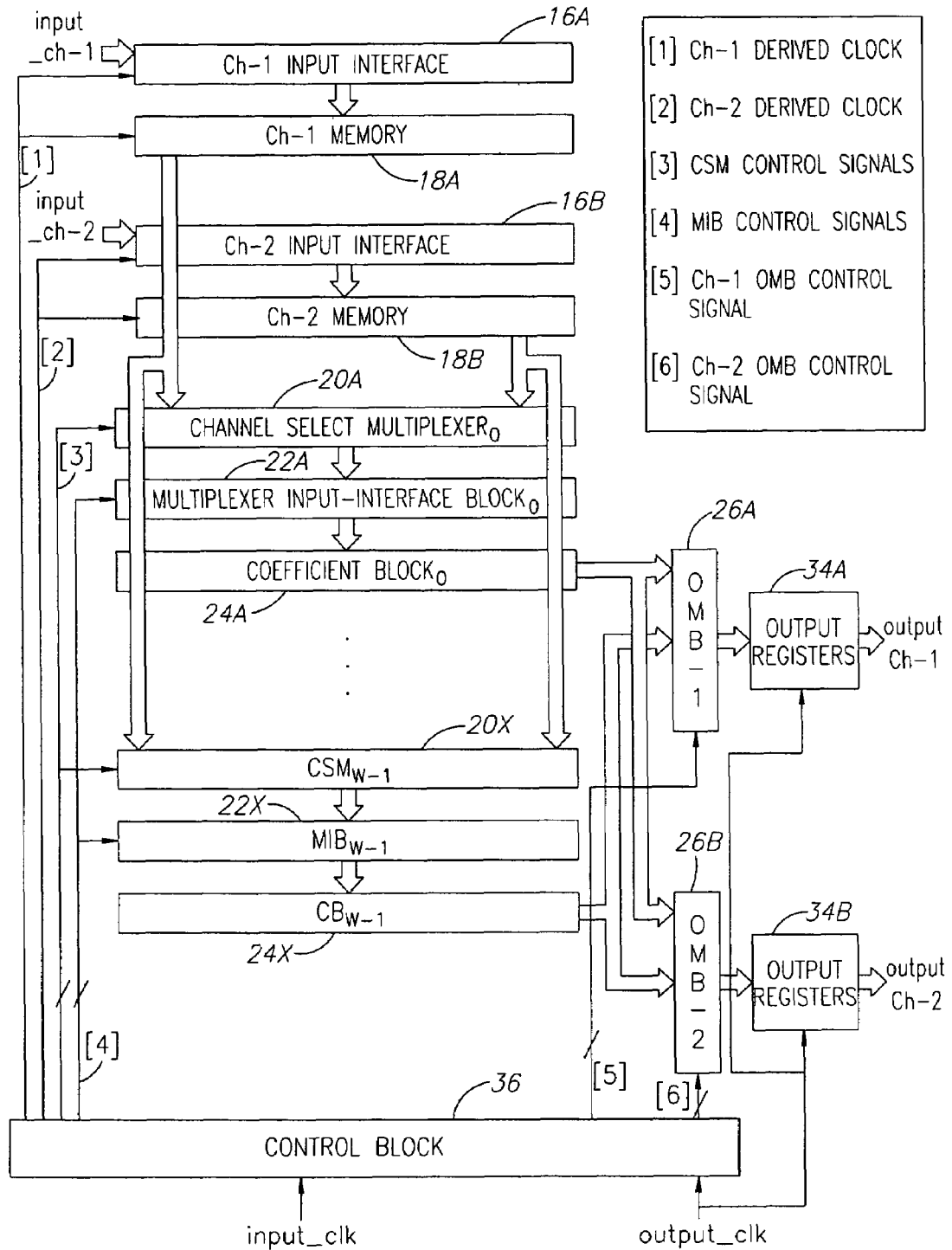
FIG. 20 illustrates the generalized structure of 2-L-FIR filter according to one embodiment of the instant invention.

A generalized structure for 2-L-FIR filter according to one embodiment of the invention is illustrated in FIG. 20 is elaborated as follows:

Inputs to the filter with bus names 'Input_ch_1', 'Input_ch_2' are connected to corresponding channel input of the input interface (II) blocks 16A, 16B. The output of the II block 16A is connected to the memory block [$M_1$] 18A and the output of II block 16B is connected to the memory block [$M_2$] 18B. The memory blocks 18A, 18B provide the synchronized data output to a plurality of CSM Blocks (CSM$_0$ to CSM$_{W-1}$) 20A ... 20X that select a channel for implementing mirror image coefficient banks (MIB's). The data from the MIB's is further fed to the OMB for selective filtering and saturation. The delay between channels might induce undesirable delay in the characteristic parameters of the filter, this undesirable delay is equalized by the Output Register (OR) block.

Figure 21:
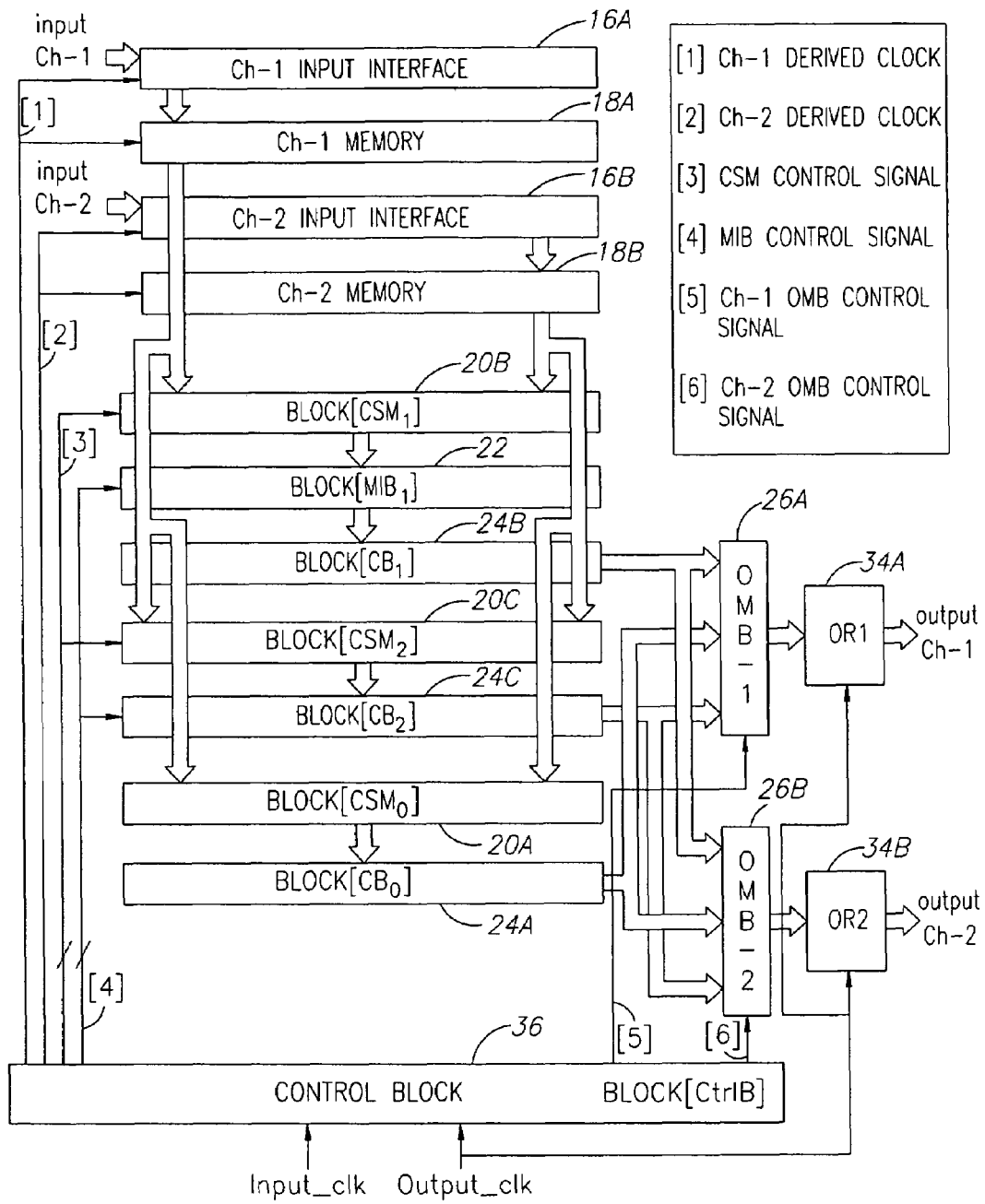
FIG. 21 illustrates the structure of 2-L-FIR filter for a given set of data in accordance with one embodiment of the instant invention.

The hardware details obtained for the 1-LFIR filter as; the number of taps and coefficient banks are retained for implementation of 2-L-FIR filter. The structure of the 2-L-FIR filter of the example FIR filter is shown in FIG. 21. Before explaining the connectivity of each block of the 2-L-FIR filter, we refer to Table 9, which states that the structure will have two memories with four unit sample delays, one MIB as there is only one mirror image coefficient bank, three coefficient banks (according to the above stated step 42. There are three CSM's (20A-C) associated with three CB's (24A-C) to switch between the channels at the input of the coefficient banks, two OMB's 26A, 26B for each channel with three input buses as there are three coefficient banks and an output register (34A, 34B) for each channel. Number of unit sample delays in memory for each channel=4, each delay element has size 'ipprec=10' and each coefficient bank has associated Channel Select Multiplexer (CSM). The CSM has 'T1=4' (T1 is the length of the filter) and 'ipprec=10'; and the output of the coefficient bank is of size 'ipprec+G'=19. The number of Multiplexer Input-interface blocks is one as there is only one mirror image coefficient bank. For the Output Multiplexer Block; Gain=9 bit, ipprec=10, opprec=10 bits and B=7 bits. Extending the 1-L-FIR and 2-L-FIR filter structure to N channels would involve simultaneous usage of N, 1-L-FIR filters or N/2 2-L-FIR filters. Thus, the instant invention is extended for realization of the Polyphase Filter up to N number of channels, to thereby imply maximum resource sharing for minimum hardware implementation of the Polyphase Interpolation filter.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A minimal area integrated polyphase interpolation filter using symmetry of coefficients for input signals in plural channels of input data, comprising: an input interface block for synchronizing the input signal to a first internal clock signal to produce a synchronized input signal; a memory block connected to an output of said input interface block for providing plural delayed output signals in response to said synchronized input signal and said first internal clock signal; a channel select multiplexer block receiving the delayed output signals from the memory block of each channel and selecting one of the channels in response to a first set of internal control signals; a multiplexer input interface block connected to said channel select multiplexer block for receiving input from said selected channel to output a plurality of signals for generating mirror image coefficient values in response to a second set of internal control signals; a coefficient block receiving said plurality of signals for generating mirror image coefficient sets and symmetric coefficient sets, and outputting a plurality of filtered signals by performing multiplication and addition on a set of coefficient inputs and said plurality of signals, the output multiplexer block comprising a bit dropping block for controlling gain in said plurality of signals, a multiplexer for selecting a signal from said plurality of signals, and a saturator block for controlling the number of bits in the output data; an output multiplexer block connected to said coefficient block for controlling a gain in said plurality of filtered signals and selecting a signal from said plurality of filtered signals followed by controlling the number of bits in said signal, thereby generating a filtered output signal, in response to a third set of internal control signals; an output register block connected to said output multiplexer block for storing and synchronizing said filtered output signal, in response to a second internal clock signal; and a control block receiving an external input clock signal for generating said first and second internal clock signals and said first, second and third internal control signals, the control block also inducing delay between two channels to access one coefficient set, thereby minimizing hardware requirement of coefficient set implementation in a polyphase interpolation filter, the control block structured to induce a delay of one clock cycle between the first internal clock signal and the external input clock signal for an odd interpolation factor, and a delay of two clock signal cycles for even values of the interpolation factor and a filter-type variable; wherein said multiplexer input interface block is a null set for a null mirror image coefficient set.

2. The filter as claimed in claim 1, wherein said input interface block includes at least one unit sample delay.

3. The filter as claimed in claim 1, wherein said memory block includes at least one unit sample delay.

4. The filter as claimed in claim 1, wherein said multiplexer input interface block includes a plurality of multiplexers.

5. The filter as claimed in claim 1, wherein said coefficient block includes a plurality of multipliers and adders or a plurality of shifters and adders interconnected to each other for generating said mirror image coefficient sets.

6. The filter as claimed in claim 1, comprising N channels to thereby implement maximum resource sharing hardware realization.

7. An integrated polyphase interpolation filter using symmetry of coefficients for an input signal of input data, comprising: an input interface block for synchronizing the input signal to a first internal clock signal to produce a synchronized input signal; a memory block connected to an output of said input interface block for providing plural delayed output signals in response to said synchronized input signal and said first internal clock signal; a multiplexer input interface block connected to the memory block for receiving the plural delayed output signals to output a plurality of signals for generating mirror image coefficient values in response to a second set of internal control signals; a coefficient block receiving said plurality of signals for generating mirror image coefficient sets and symmetric coefficient sets, and outputting a plurality of filtered signals; an output multiplexer block connected to said coefficient block for controlling a gain in said plurality of filtered signals and selecting a signal from said plurality of filtered signals, thereby generating a filtered output signal, in response to a third set of internal control signals, the output multiplexer block comprising a bit dropping block for controlling gain in said plurality of signals, a multiplexer for selecting a signal from said plurality of signals, and a saturator block for controlling the number of bits in the output data; an output register block connected to said output multiplexer block for storing and synchronizing said filtered output signal, in response to a second internal clock signal; and a control block receiving an external input clock signal for generating said first and second internal clock signals and said first, second and third internal control signals, the control block also inducing delay between two channels to access one coefficient set, the control block structured to induce a delay of one clock cycle between the first internal clock signal and the external input clock signal for an odd interpolation factor, and a delay of two clock signal cycles for even values of the interpolation factor and a filter-type variable.

8. The filter of claim 7, wherein said input interface block includes at least one unit sample delay.

9. The filter of claim 7, wherein said memory block includes at least one unit sample delay.

10. The filter of claim 7, wherein said multiplexer input interface block includes a plurality of multiplexers.

11. The filter of claim 7, wherein said coefficient block includes a plurality of multipliers and adders interconnected to each other for generating said mirror image coefficient sets.

* * * * *